US007947522B2

(12) United States Patent
Ohtsuka

(10) Patent No.: US 7,947,522 B2
(45) Date of Patent: May 24, 2011

(54) METHOD OF PRODUCTION OF SEMICONDUCTOR DEVICE AND METHOD OF PRODUCTION OF SOLID-STATE IMAGING DEVICE

(75) Inventor: Emi Ohtsuka, Toyama (JP)

(73) Assignee: Panasonic Corporation, Osaka (JP)

( * ) Notice: Subject to any disclaimer, the term of this patent is extended or adjusted under 35 U.S.C. 154(b) by 330 days.

(21) Appl. No.: 12/243,310

(22) Filed: Oct. 1, 2008

(65) Prior Publication Data
US 2009/0124036 A1    May 14, 2009

(30) Foreign Application Priority Data

Nov. 8, 2007    (JP) .................................. 2007-290370

(51) Int. Cl.
*H01L 21/00*    (2006.01)
*H01L 21/76*    (2006.01)
(52) U.S. Cl. .......... 438/57; 438/424; 438/427; 438/430; 257/E25.002
(58) Field of Classification Search .................... 438/57, 438/424, 427, 430, 437
See application file for complete search history.

(56) References Cited

U.S. PATENT DOCUMENTS

| 5,961,794 | A | 10/1999 | Morita |
| 6,617,663 | B2 | 9/2003 | Horie et al. |
| 7,115,478 | B2 | 10/2006 | Mukai et al. |
| 2007/0087518 | A1* | 4/2007 | Ochi et al. ................... 438/424 |

FOREIGN PATENT DOCUMENTS

JP    2004-111527    4/2004

* cited by examiner

*Primary Examiner* — N Drew Richards
*Assistant Examiner* — Mamadou Diallo
(74) *Attorney, Agent, or Firm* — McDermott Will & Emery LLP

(57) ABSTRACT

A method of production of a semiconductor device includes: forming a pattern having open element isolation regions on a first insulating film situated on a semiconductor substrate; forming trenches at the element isolation regions on the semiconductor substrate; forming a second insulating film on the first insulating film and inside the trenches; forming holes in the second insulating film in active regions sectioned by the element isolation regions; and leaving the second insulating film inside the trenches only. An interval between an outer perimeter of each the active regions and an outer perimeter of each of the holes in each of the active regions is set such that the interval in the first circuit region, in which a total area of the active regions is relatively large, is smaller than the interval in the second circuit region, in which the total area of the active regions is relatively small.

9 Claims, 9 Drawing Sheets

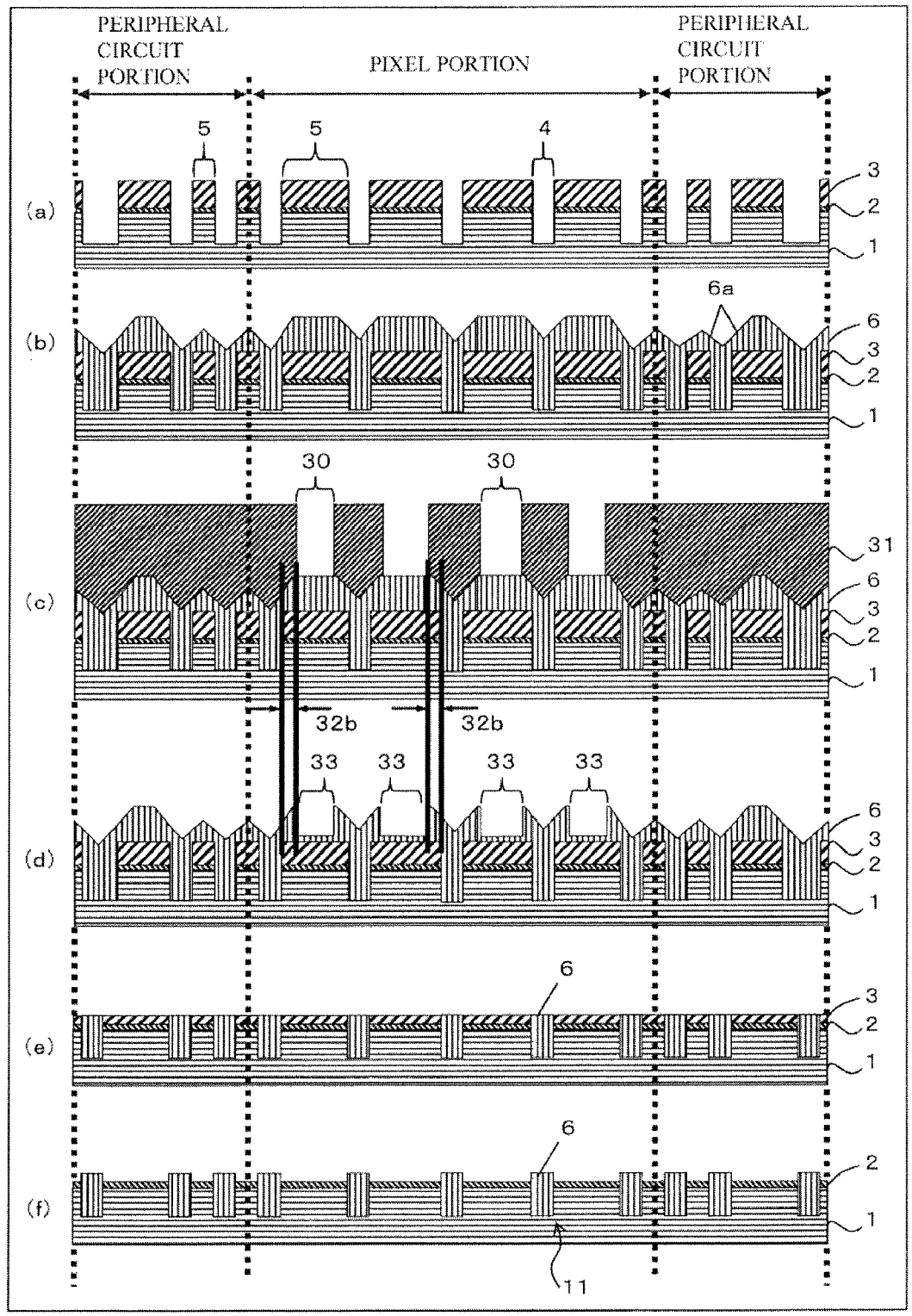

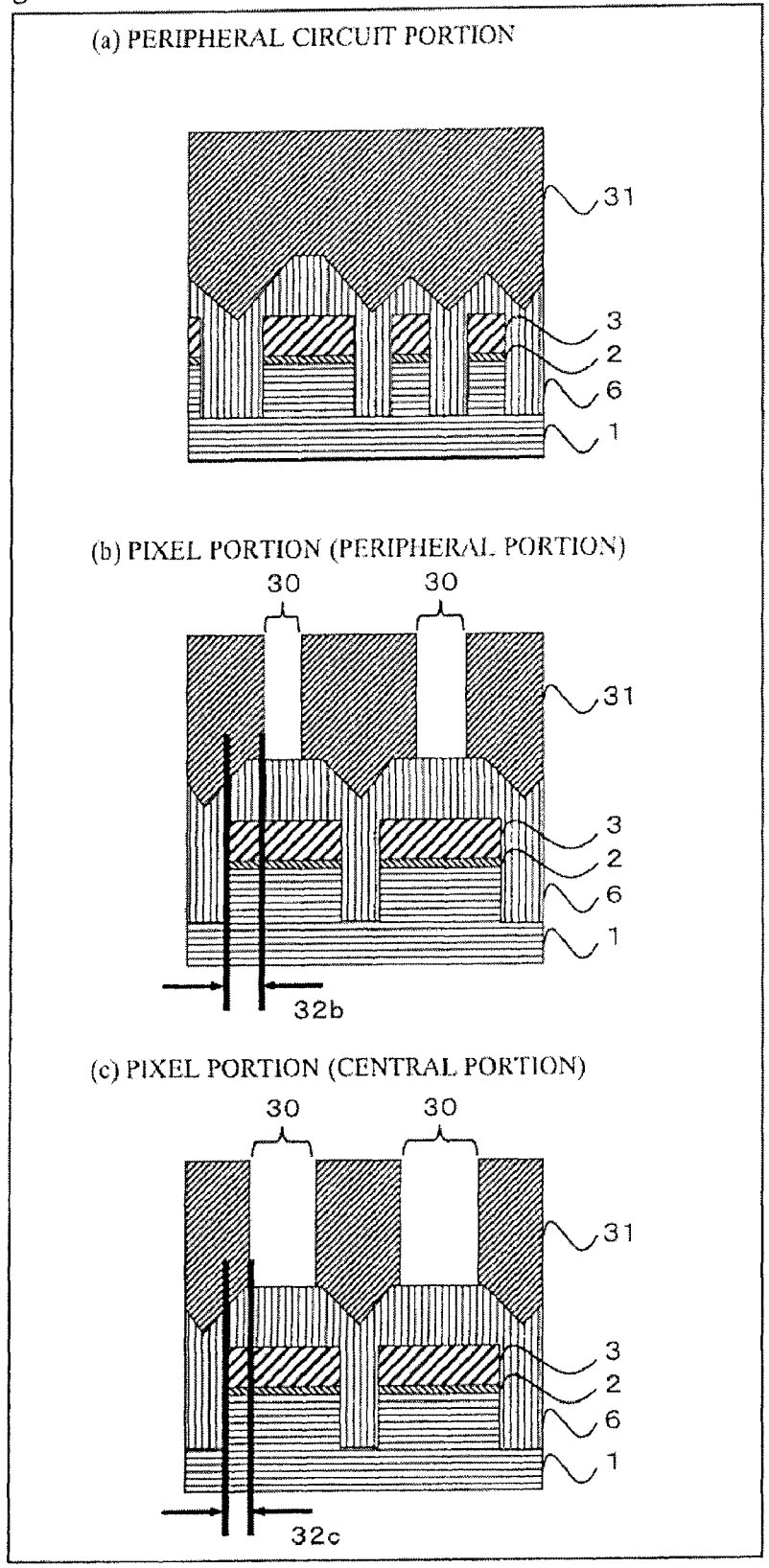

METHOD OF PRODUCTION OF SEMICONDUCTOR DEVICE AND METHOD OF PRODUCTION OF SOLID-STATE IMAGING DEVICE

BACKGROUND OF THE INVENTION

1. Field of the Invention

The present invention relates to a method of production of a semiconductor device which has an element isolation structure, and more particularly relates to a method of production of a solid-state imaging device, which is capable of realizing a preferable surface flatness when a Shallow Trench Isolation (STI) type element isolation region is formed by a Chemical Mechanical Polishing (CMP).

2. Description of the Background Art

In recent years, a semiconductor device has become highly integrated, and respective elements tend to be significantly refined. Therefore when the semiconductor device is produced, an STI-type element isolation is mainly used, in which the elements of the semiconductor device are isolated from one another by filling shallow trenches, which are formed on a semiconductor substrate, with an insulating material. As a method for forming the STI-type element isolation structure (STI structure), various methods are known, and a typical forming method will be described with reference to FIG. 4. FIG. 4 is a cross-sectional view illustrating a process of a forming method of a conventional STI structure.

For example, on a semiconductor substrate 1 shown in FIG. 4(a), a silicon dioxide film 2 and a silicon nitride film 3, which are insulating materials, are deposited in this order, and the silicon nitride film 3 and the silicon dioxide film 2 are selectively dry-etched by using a resist pattern (not shown), which is formed on the silicon nitride film 3, as a mask. Accordingly, a pattern in which element isolation regions are open is formed in the silicon dioxide film 2 and the silicon nitride film 3. Thereafter, as shown in FIG. 4(a), the semiconductor substrate 1 is selectively dry-etched by using the silicon nitride film 3 as the mask, whereby trenches 4 are formed at all the element isolation regions. In active regions 5 (regions other than the element isolation regions) which are sectioned by the trenches 4, elements are actually formed.

Next, an extra-thin thermally-oxidized film is formed, through thermal oxidation, on inside walls of the trenches 4, and then by using a CVD method, a silicon dioxide film 6, which is the insulating material, is formed on the whole surface of the semiconductor substrate 1 so as to fill inside the trenches 4 with the silicon dioxide film 6. FIG. 4(b) is a cross-sectional view illustrating a process in which the silicon dioxide film 6 is formed. Thereafter, as shown in FIG. 4(c), a pattern of resist 8, which has openings 7 only in such active regions 5 that each has a predetermined area size or larger, is formed on the silicon dioxide film 6. The silicon dioxide film 6, which is exposed through the openings 7, is etched by using the resist 8 as the mask, and then holes 9 are formed in the silicon dioxide film 6 as shown in FIG. 4(d). An interval between one edge of one of the active regions 5 sectioned by the trenches 4 and an edge, being closest to the one edge of the active region 5, of the hole 9 formed in the active region 5, is constant in the respective active regions 5 on the whole region of the semiconductor device, as shown in FIGS. 4(c) and 4(d). Further, an interval between an outer perimeter of one of the active regions 5 sectioned by the trenches 4 and an outer perimeter of the hole region 9 formed in the active region 5 is constant in each of the active regions 5 on the whole region of the semiconductor device.

Next, apart of the silicon dioxide film 6 which is formed on the silicon nitride film 3 and a part of the silicon nitride film 3 are removed by using a CMP method. Accordingly, as shown in FIG. 4(e), the silicon dioxide film 6 remains inside the trenches 4 only, and a structure in which the trenches 4 are filled with the silicon dioxide film 6 is generated. The silicon nitride film 3 is polished together with the silicon dioxide film 6 or independently thereof until the silicon nitride film 3 has a predetermined film thickness. The predetermined film thickness is determined such that a final STI step height does not adversely affect various electrical characteristics. After the polishing based on the CMP method, the silicon nitride film 3 is removed by using thermal phosphate, whereby an STI structure 11 shown in FIG. 4(f) is formed. Thereafter, although not shown in the diagram, the silicon dioxide film 2 is removed by using a hydrofluoric acid series etching liquid, a gate insulating film is formed on the semiconductor substrate 1, and then a conductive film such as a polysilicon film including impurities such as phosphorus and arsenic is deposited on the semiconductor substrate 1 as well as on the silicon dioxide film 6.

In the above-described forming process of the conventional STI structure 11, a case will be considered where the silicon dioxide film 6, on which step heights having projections and depressions are formed by the trenches 4 as shown in FIG. 4(b), is flattened by using the CMP method instead of using the processes shown in FIGS. 4(c) and 4(d). Conventionally, it is known that a polishing characteristic (particularly, a polishing speed depending on a location) changes drastically in accordance with an area and a pattern density of the active region 5, which is a base. Specifically, when the area of the base active region 5 is large, a polishing pressure for pressing the semiconductor substrate 1 onto a polishing pad decreases per unit area, and the polishing speed slows down. Therefore, when the silicon dioxide film 6 is flattened from the state shown in FIG. 4(b) by using the CMP method, the film thickness of the remaining silicon dioxide film 6 becomes thick in such active regions 5 that have large areas. That is, a difference (an STI step height) between a height of an upper surface of the STI structure 11 shown in FIG. 4(f) and a height of an upper surface of the semiconductor substrate 1 is large. The STI step height is defined as a distance d between the upper surface of the semiconductor substrate 1 and the upper surface of the STI structure 11 (the upper surface of the silicon dioxide film 6) as shown in FIG. 5. FIG. 5 is an enlarged diagram of the STI structure 11 in which the silicon dioxide film 2 has been removed from the state shown in FIG. 4(f).

In this manner, when the STI step height is finished as a high step height, a process failure may be caused by exposure/focus abnormalities during various types of mask layer patterning in the production process of the semiconductor device after the STI structure 11 is formed thereon. Further, the conductive polysilicon film remains on a sidewall of the step height portion of the STI structure 11 of the silicon dioxide film 6, the step height portion protruding from the upper surface of the semiconductor substrate 1, and consequently, a leak between the elements may be caused. FIG. 6 is a diagram illustrating a mechanism of the leak occurring between the elements. As shown in FIG. 6(a), the silicon dioxide film 6 is filled in the semiconductor substrate 1, and the step height portion of the silicon dioxide film 6 is wet-etched through a certain process. Accordingly, an overhang shape 12 is formed in the sidewall of the step height portion. A conductive polysilicon film 13, which is used as a gate electrode, is formed thereon (FIG. 6(b)). When the polysilicon film 13 is patterned by anisotropic etching, and when the electrode 14 is formed, an upper portion of the overhang shape 12 acts as an etch stop film, and the polysilicon film remains at a recessed portion of the overhang shape 12 as a residual polysilicon 15. The residual polysilicon 15 causes the leak between the elements at a specific portion on the semiconductor substrate 1. Further, when the STI step height is finished as the high step height, the polysilicon film 13, which extends over the step height portion of the silicon dioxide film 6, stresses the silicon dioxide film 6 so as to press down the silicon dioxide film 6. As a result, various characteristic failures are caused such as a crystal defect at a bottom of the silicon dioxide film 6.

In order to prevent such a problem, and in order that the STI step height is not finished as a high step height, the processes shown in FIGS. 4(c) and 4(d) are performed before the CMP polishing in the conventional method shown in FIG. 4. That is, in the conventional method shown in FIG. 4, the holes 9 are formed in the silicon dioxide film 6 which is deposited on such active regions 5 that each has the predetermined area size or larger. Accordingly, the amount of polishing based on the CMP is preliminarily reduced so as to equalize the polishing speed, and the STI step height is prevented from becoming high.

Further, in order to prevent the STI step height from becoming high, a method different from that shown in FIG. 4 is disclosed in Japanese Laid-Open Patent Publication No. 2004-111527. According to the method disclosed in Japanese Laid-Open Patent Publication No. 2004-111527, a calculation is performed in simulation so as to equalize, in a chip, density and shapes of portions of the silicon dioxide film 6 to be removed, the silicon dioxide film 6 being deposited on the respective active regions 5. In accordance with a result of the calculation, the amount of polishing based on the CMP method is preliminarily reduced and the polishing speed is equalized.

A MOS type solid-state imaging device is a type of a semiconductor device, and includes a pixel portion having arranged thereon a plurality of pixels each having a photodiode which is formed on the active regions and which performs a photoelectric conversion on an incident light, and also includes a peripheral circuit portion which has a plurality of MOS transistors formed on the active regions. In the case of the MOS type solid-state imaging device, a pattern layout per pixel in the pixel portion is as shown in FIG. 7. FIG. 7 is a diagram showing a pattern layout per pixel in the pixel portion of the MOS-type solid-state imaging device. In FIG. 7, 20 denotes a photo-receiving portion composed of the photodiode, 21 denotes a plurality of drive MOS transistors, 22 denotes a floating diffusion, 23 denotes a forward gate electrode which forwards a signal charge generated by the photo-receiving portion 20 to the floating diffusion 22, 24 denotes a contact hole for connecting the floating diffusion 24 to another MOS transistor. The area of the active region to be used in one photo-receiving portion 20 is larger than the area of the active region to be used in the peripheral circuit, which is not shown in the diagram. The pixel portion is composed by arranging thereon several million to several ten million pattern layouts each having the photo-receiving portion 20 shown in FIG. 7. In this manner, the area occupied by the active regions in the pixel portion is larger than the area occupied by the active regions in the peripheral circuit portion.

In the case where the STI structure is formed on the MOS type solid-state imaging device by using the CMP method, the STI step height tends to be high, since the area occupied by the active regions in the pixel portion having the photo-receiving portions 20 is larger than the area occupied by the active regions in the peripheral circuit portion, and consequently the polishing speed in the pixel portion is slower than that in the peripheral circuit portion. Further, even in the pixel portion, from its central portion to peripheral portion, STI step height tends to be biased. Particularly, these tendencies of the high step height and the biased STI step height become significant, when the area of the photo-receiving portion 20 (an area per pixel) is large, when the number of photo-receiving portions 20 arranged on one chip (the number of pixels in the pixel portion) is great, and when the pixel portion occupies a large proportion of the chip. The high STI step height and the biased STI step height in the pixel portion are likely to induce the various characteristic failures, the process failure caused by the exposure/focus abnormalities, or the leak between the elements. In addition, failures specific to the solid-state imaging device may occur such as a saturation characteristic failure, and a black defect and a white defect on an image.

Even if the conventional method shown in FIG. 4 is applied to the above-described MOS type solid-state imaging device, in the conventional method shown in FIG. 4, the holes 9 are formed at constant intervals 10 on the whole region regardless of the pixel portion and the peripheral portion. Therefore, it is impossible to sufficiently prevent the STI step height in the pixel portion from becoming high and to sufficiently suppress the biased STI step height in the pixel portion. Further, the method disclosed in Japanese Laid-Open Patent Publication No. 2004-111527 is directed to general semiconductor devices, and not directed to the MOS type solid-state imaging device. Therefore, even if the method disclosed in Japanese Laid-Open Patent Publication No. 2004-111527 is applied to the MOS type solid-state imaging device, it is impossible to sufficiently prevent the STI step height in the pixel portion from becoming high and to sufficiently suppress the biased STI step height in the pixel portion.

In this manner, the conventional method shown in FIG. 4, and the method disclosed in Japanese Laid-Open Patent Publication No. 2004-111527 have the problem in that it is impossible to sufficiently prevent the STI step height in the pixel portion from becoming high and to sufficiently suppress the biased STI step height in the pixel portion.

SUMMARY OF THE INVENTION

Therefore, an object of the present invention is to solve the above-described problem. The object is to produce a semiconductor device such as the MOS type solid-state imaging device which is capable of sufficiently preventing, at the time of forming the STI structure by using the CMP method, the STI step height in the pixel portion from becoming high and of sufficiently suppressing the biased STI step height in the pixel portion, the pixel portion having the active regions occupying a large portion thereof. Further, the object is to produce a semiconductor device which is capable of equalizing the STI step height on the chip.

A method of production of semiconductor device according to the present invention is directed to solve the above-described problem. The method of production of the semiconductor device according to the present invention is directed to a method of production of a semiconductor device which includes a first circuit region and a second circuit region each having active regions for forming elements, and in which a total area of the active regions included in the first circuit region in proportion to a whole area of the first circuit region is greater than a total area of active regions included in the second circuit region in proportion to a whole area of the second circuit region. The method of production includes the processes of: forming a first insulating film on a whole of the first circuit region and a whole of the second circuit region which are situated on a semiconductor substrate and forming, by selectively etching the first insulating film, a pattern having element isolation regions which are open and which section the active regions included in each of the first circuit region and second circuit region; forming trenches at all the element isolation regions by etching the semiconductor substrate using the first insulating film having the pattern formed therein as a mask; forming a second insulating film so as to cover the whole of the first circuit region and the whole of the second circuit region, which are situated on the first insulating film having the pattern formed therein, and so as to fill inside the trenches; forming holes in the active regions which are sectioned by the element isolation regions by selectively etching the second insulating film; and leaving the second insulating film inside the trenches only by polishing and removing the second insulating film having the holes formed therein. At the time of forming the holes, an interval between an outer perimeter of each of the active regions sectioned by the element isolation regions and an outer perimeter of each of the holes formed in said each of the active regions is set such that the interval in the first circuit region is smaller than the interval in the second circuit region.

With such method of production of the semiconductor device, it is possible to equalize the STI step height, which is a difference in height generated between the upper surface of the second insulating film left only inside the trenches and the upper surface of the semiconductor substrate, in the first circuit region and in the second circuit region having the active regions whose total areas occupying the first circuit region and the second circuit region respectively are different from each other. That is, it is possible to prevent the STI step height in the first circuit region, which has the active regions occupying a larger proportion thereof, from becoming high. Further, it is possible to sufficiently suppress a bias in the STI step height in the first circuit region.

Preferably, the intervals in the first circuit region and in the second circuit region may be set such that, with respect to a unit area of the active regions which are sectioned by the element isolation regions, an area of remaining regions in the first circuit region is equal to that in the second circuit region, the area of the remaining regions in the first circuit region and the second circuit region being obtained by subtracting an area of the holes in the active regions from an area of the active regions. Alternatively, the intervals in the first circuit region and in the second circuit region may be set such that a result of division of a total area of the remaining regions by the total area of the active regions which are sectioned by the element isolation regions in the first circuit region, the total area of the remaining regions being obtained by subtracting a total area of the hole regions in the active regions from the total area of the active regions in the first circuit region, is equal to a result of division of the same in the second circuit region.

Still preferably, the semiconductor device is a solid-state imaging device. The first circuit region is a pixel portion having arranged thereon a plurality of pixels each having a photodiode which is formed in each of the active regions and which performs photoelectric conversion on an incident light. The second circuit region is a peripheral circuit portion which has a plurality of transistors formed in the active regions. Accordingly, it is possible to sufficiently prevent the STI step height in the pixel portion from becoming high, and also possible to sufficiently suppress the bias in the STI step height in the pixel portion. Therefore, it is possible to prevent occurrence of failures specific to the solid-state imaging device such as the saturation characteristic failure, and the black defect and the white defect on an image. Further, in this case, the intervals in the pixel portion may be set with respect to each of the active regions, which are sectioned by the element isolation regions, such that the intervals become larger going from a central portion to a peripheral portion of the pixel portion. Accordingly, it is possible to further sufficiently suppress the bias in the STI step height in the pixel portion.

Still preferably, the method of production may further include the processes of: forming a conductive film on the semiconductor substrate after the second insulating film is left inside the trenches only; and forming electrodes or wirings which extend over the second insulating film left inside the trenches only by selectively etching the conductive film. In these processes, it is possible to prevent the STI step height in the first circuit region from becoming high and also possible to sufficiently suppress the bias in STI step height in the first circuit region. Therefore, it is possible to prevent occurrence of the leak between the elements, the leak being caused by the conductive film left on the sidewall of the STI step height.

Further, the present invention is directed to a method of production of a solid-state imaging device. The method of production of the solid-state imaging device according to the present invention includes a pixel portion having arranged thereon a plurality of pixels respectively having photodiodes which are formed in active regions and which perform photoelectric conversion on an incident light, and also includes a peripheral circuit portion which has a plurality of transistors formed in the active regions. The method of production includes the processes of: forming a first insulating film on a whole of the pixel portion and on a whole of the peripheral portion both of which are situated on a semiconductor substrate, and forming, by selectively etching the first insulating film, a pattern having element isolation regions which are open and which section the active regions included in each of the pixel portion and the peripheral portion; forming trenches at the element isolation regions by selectively etching the semiconductor substrate using the first insulating film having the pattern formed therein as a mask; forming a second insulating film so as to cover the whole of the pixel portion and the whole of the peripheral portion which are situated on the first insulating film having the pattern formed therein, and so as to fill inside the trenches; forming, by selectively etching the second insulating film, holes in the active regions which are sectioned by the element isolation regions; and leaving the second insulating film inside the trenches only by polishing and removing the second insulating film having the holes formed therein. At the time of forming the holes, the holes are formed only in the pixel portion.

According to the method of production of the solid-state imaging device as above described, it is possible to equalize the STI step height, which is the difference in height generated between the upper surface of the second insulating film left inside the trenches only and the upper surface of the semiconductor substrate, in the pixel portion and the peripheral portion having the active regions whose total areas occupying the first circuit region and the second circuit region respectively are different from each other. That is, it is possible to sufficiently prevent the STI step heights in the pixel portion, which has the active regions occupying a larger portion thereof, from becoming high. Further, it is possible to sufficiently suppress the bias in the STI step height in the pixel portion. As a result, it is possible to prevent the failures specific to the solid-state imaging device such as the saturation characteristic failure, and the black defect and the white detect on the image.

As above described, according to the present invention, at the time of forming the STI structure by using the CMP method, it is possible to prevent the STI step height in a region such as the pixel region, which has the active regions occupying a relatively larger portion thereof, from becoming high. It is also possible to suppress the bias in the STI step height in the region. Accordingly, it is possible produce a semiconductor device such as a MOS type solid-state imaging device which is capable of equalizing the STI step height in a chip included therein.

These and other objects, features, aspects and advantages of the present invention will become more apparent from the following detailed description of the present invention when taken in conjunction with the accompanying drawings.

BRIEF DESCRIPTION OF THE DRAWINGS

FIG. 8 is a cross-sectional view illustrating a process of a method of production of a MOS type solid-state imaging device in which holes are formed only in a pixel portion according to the present invention;

FIG. 9 is a diagram showing a cross-sectional view of the semiconductor device in the case where holes are formed only in a pixel portion and where an interval in a central portion of the pixel portion is different from that in a peripheral portion of the same.

DESCRIPTION OF THE PREFERRED EMBODIMENTS

Figure 1:
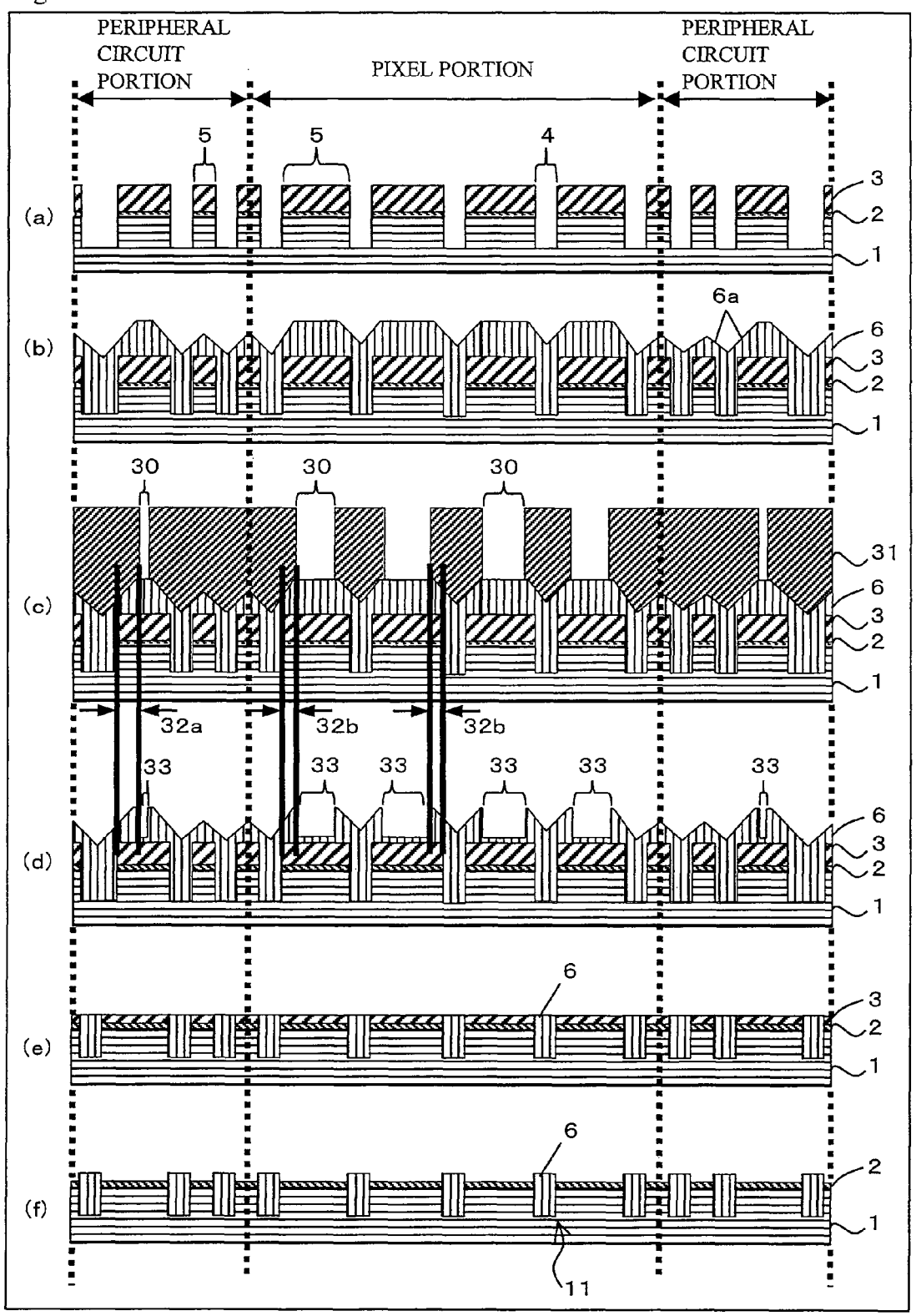
FIG. 1 is a cross-sectional view illustrating a process of a method of production of a MOS type solid-state imaging device according to the present invention.
Figure 4:
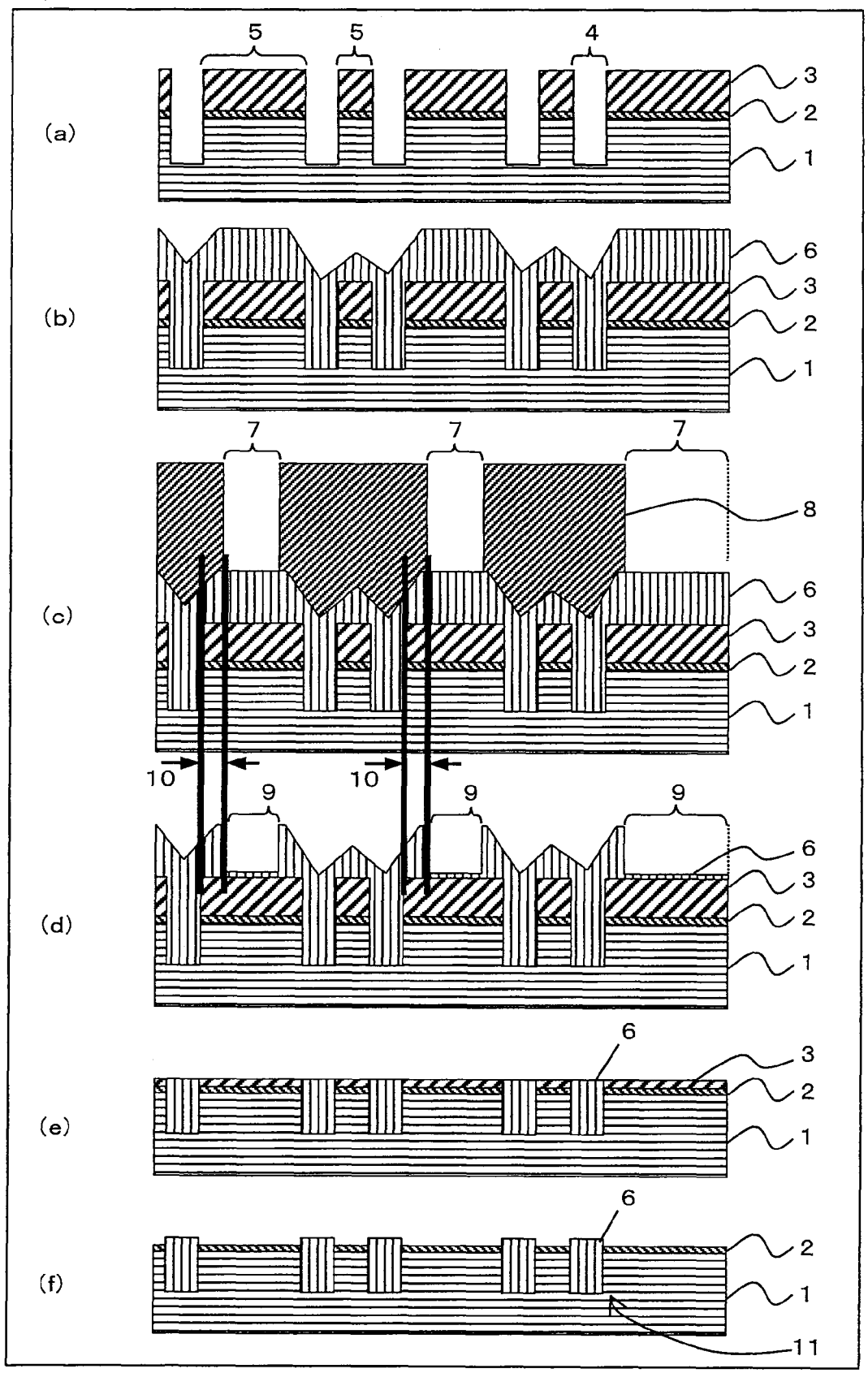
FIG. 4 is a cross-sectional view illustrating a process of forming a conventional STI structure.
Figure 5:
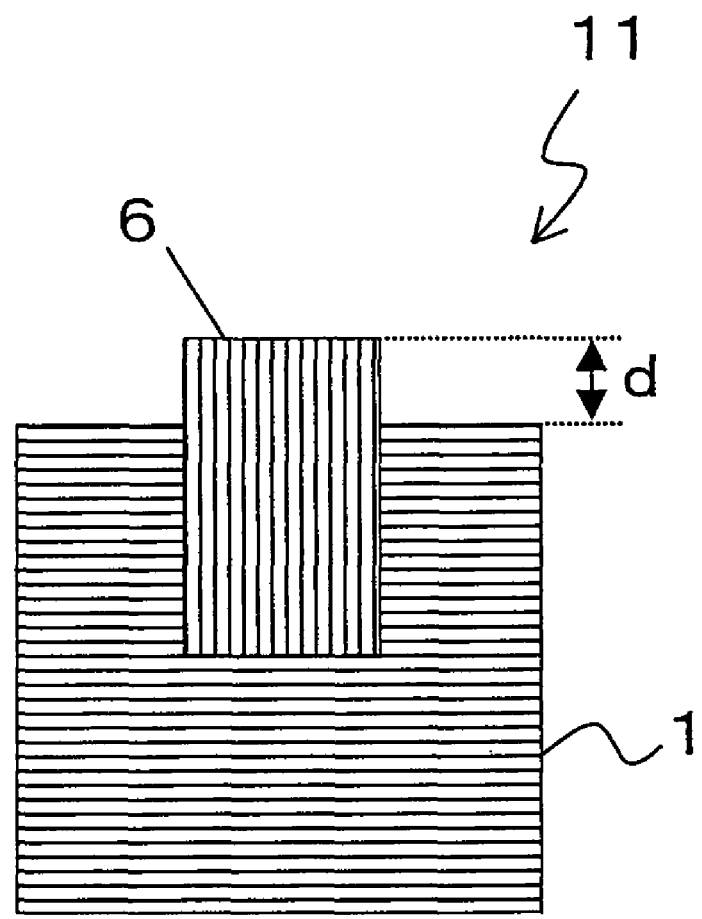
FIG. 5 is an enlarged view of an STI structure 11 in which a silicon dioxide film 2 has been removed from a state shown in FIG. 4(f)
Figure 6:
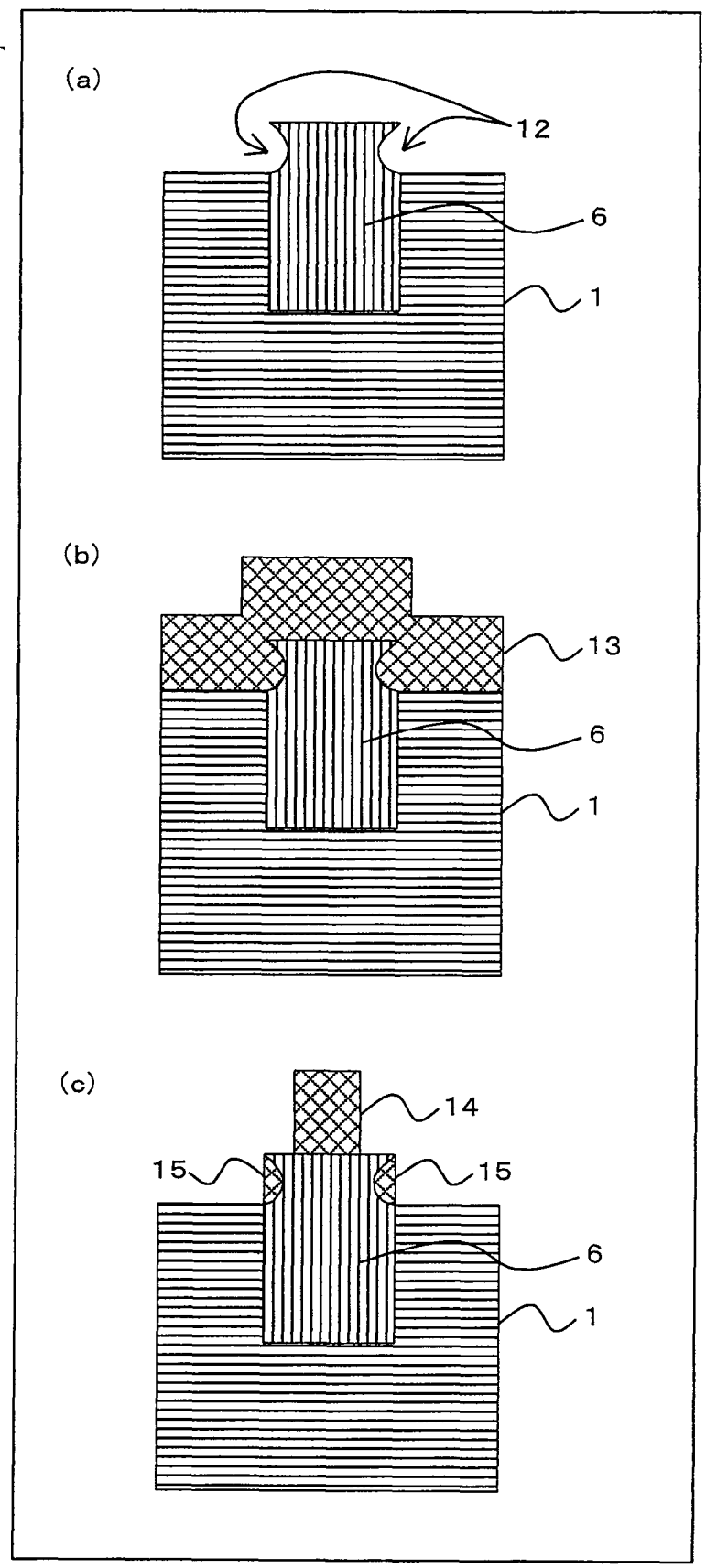
FIG. 6 is a diagram illustrating a mechanism in which a leak between elements occurs.
Figure 7:
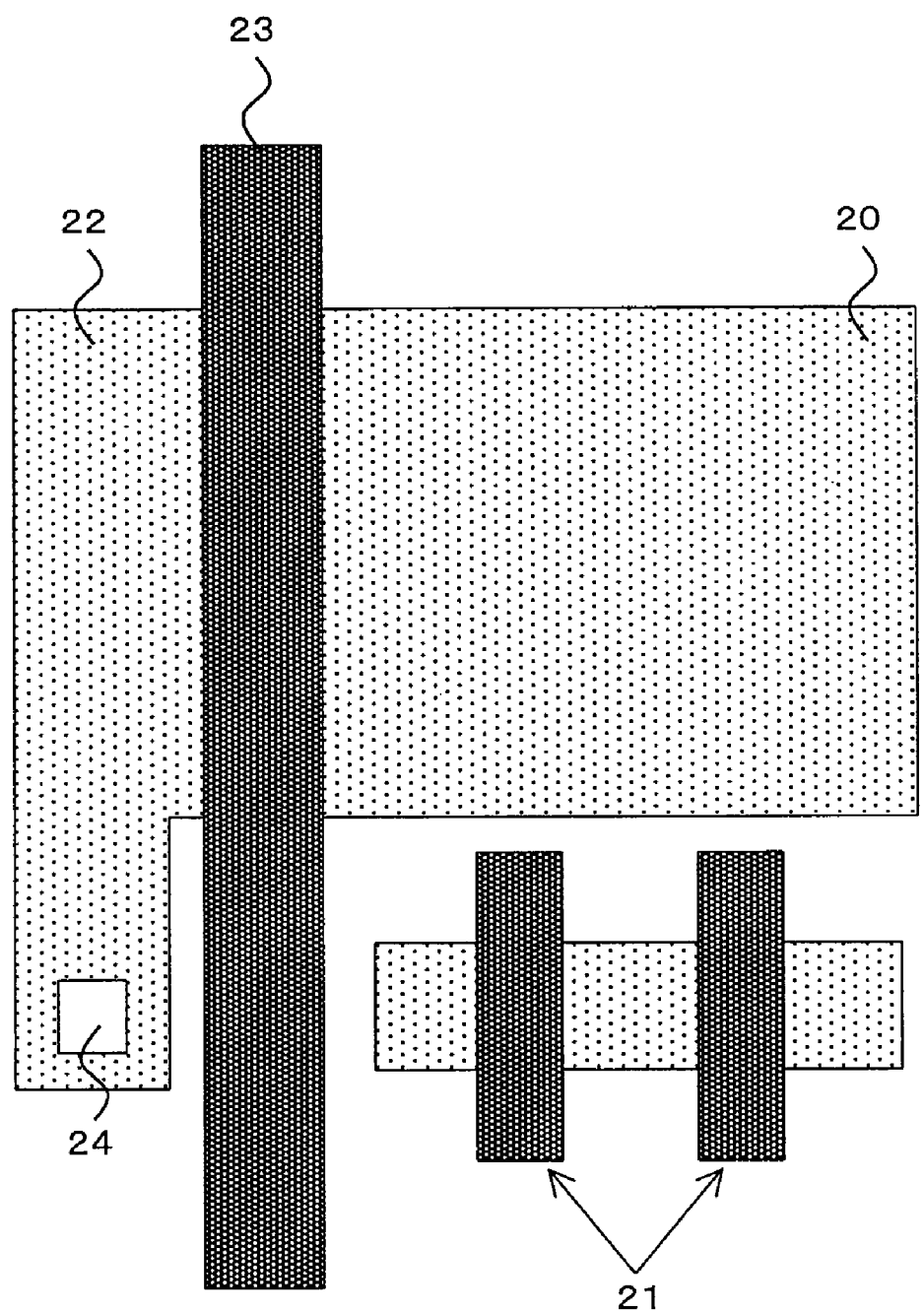
FIG. 7 is a diagram showing a pattern layout of a pixel in a pixel portion in the MOS type solid-state imaging device.

Hereinafter, with reference to diagrams, a method of production of a semiconductor device according to one embodiment of the present invention will be described. FIG. 1 is a cross-sectional view illustrating a process of a method of production of a MOS type solid-state imaging device according to the present invention. In FIG. 1, central portions of respective cross-sectional views are each referred to as a pixel portion. Both edge portions of the respective cross-sectional views are each referred to as a peripheral circuit portion in which mainly MOS transistors are formed. Further in FIG. 1, the component parts which are the same as those in FIG. 4 are denoted by the same reference characters as FIG. 4. Further, a pattern layout of a pixel in the pixel portion is the same as that shown in FIG. 7.

First, on the semiconductor substrate 1 shown in FIG. 1(a), the silicon dioxide film 2 and the silicon nitride film 3, which are insulating films, are deposited in this order, and the silicon dioxide film 2 and the silicon nitride film 3 are selectively dry-etched by using a resist pattern (not shown) formed on the silicon nitride film 3 as a mask. Accordingly, a pattern, in which element isolation regions are open, is formed in the silicon dioxide film 2 and the silicon nitride film 3. As shown in FIG. 1(a), the semiconductor substrate 1 is selectively and anisotropically dry-etched by using the silicon nitride film 3 as the mask, whereby the trenches 4 are formed at all the element isolation regions. The anisotropic dry etching may be performed while the above-described resist pattern remains or after the resist pattern has been removed. The active regions 5 sectioned by the trenches 4 (element isolation regions) correspond to such active regions, in the pixel portion, that have formed thereon the photo-receiving portions 20, the drive MOS transistors 21 and the like, and also correspond to such active regions, in the peripheral circuit portion, that have formed thereon the MOS transistors, capacities and the like.

Next, an extra-thin thermally-oxidized film is formed on the inside walls of the trenches 4 through thermal oxidation, and the silicon dioxide film 6 is formed, by using the CVD method, on the whole surface of the semiconductor substrate 1 so as to fill inside the trenches 4 with the silicon dioxide film 6, which is the insulating film. FIG. 1(b) is a cross-sectional view of a process in which the silicon dioxide film 6 is formed. As to the CVD method, preferably, a high-density plasma CVD method is used. The high-density plasma CVD method not only applies a high-frequency power so as to generate plasma from a process gas which is used to deposit the silicon dioxide film 6 on the semiconductor substrate 1, but also applies the high-frequency power to the semiconductor substrate 1, whereby the silicon dioxide film 6 is deposited on the semiconductor substrate 1 while being etched. The high-density plasma CVD method is advantageous in that the silicon dioxide film 6 is filled in the trenches 4 in a favorable manner. Further, as shown in FIG. 1(b), due to the etching and the deposition, linear taper shapes 6a are formed in the deposited silicon dioxide film 6 in accordance with shapes of the trenches 4.

Next, a pattern of resist 31 is formed on the silicon dioxide film 6, the pattern having openings 30 only in the active regions 5 which each has an area of a predetermined size or larger, as shown in FIG. 1(c). Thereafter, the silicon dioxide film 6 exposed through the openings 30 is selectively and anisotropically dry-etched by using the resist 31 as the mask, whereby holes 33 are formed in the silicon dioxide film 6 as shown in FIG. 1(d). A method for forming the holes 33 will be described later in detail. The anisotropic dry etching is performed until the silicon dioxide film 6 below the bottom of the holes 33 has a predetermined film thickness. For example, the predetermined film thickness may be set such that the height of the upper surface of the silicon dioxide film 6 below the bottom of the hole 33 is substantially the same as the height of the lowest upper surface of the silicon dioxide film 6 deposited in the trenches 4.

Next, based on the CMP method, a part of the silicon dioxide film 6 which has been deposited on the silicon nitride film 3 and a part of the silicon nitride film 3 are removed such that the silicon dioxide film 6 remains inside the trenches 4 (FIG. 1(e)). The silicon nitride film 3 is polished together with the silicon dioxide film 6 or independently of the silicon dioxide film 6 so as to have a predetermined film thickness. The predetermined film thickness is set such that the STI step height finally obtained does not adversely affect the various electrical characteristics. After the polishing based on the CMP method, the silicon nitride film 3 is removed by using the thermal phosphate, whereby the STI structure 11 is formed (FIG. 1(f)). Thereafter, although not shown in the diagram, the silicon dioxide film 2 is removed by using a hydrofluoric acid series etching liquid, and the gate insulating film is formed on the semiconductor substrate 1. The conductive film such as the polysilicon film including impurities such as phosphorus and arsenic is deposited on the semiconductor substrate 1 and also on the silicon dioxide film 6. In both of the pixel portion and the peripheral circuit portion, the gate electrodes and wiring patterns extended therefrom are formed by the anisotropic dry etching by using the resist mask layer as the mask, the gate electrodes and the wiring patterns being partially extended over the silicon dioxide film 6 of the STI structure 11.

Hereinafter, the method for forming the holes 33 according to the present embodiment will be described in detail. As described with reference to FIG. 1, the holes 33 are formed in the silicon dioxide film 6 deposited in the active regions 5 which are sectioned by the trenches 4 and which each has an area of the predetermined size or larger. In the present embodiment, an interval 32 between one edge of one of the active regions 5 sectioned by the trenches 4 and an edge, being closest to the one edge of the active region 5, of the hole 33 formed in the active region 5 is set to be different between in the pixel portion and in the peripheral circuit portion. Specifically, in the present embodiment, an interval 32b in the pixel portion is smaller than an interval 32a in the peripheral circuit portion. A plurality of the interval 32a represents the intervals 32 in the peripheral circuit portion and a plurality of the interval 32b represents the intervals 32 in the pixel portion. A size of the interval 32a, which is situated at all sides of each of the active regions 5, is constant in the active region 5 sectioned by the trenches 4, and a size of the interval 32b, which is situated at all sides of each of the active regions 5, is also constant in the active region 5. Therefore, more specifically, in the present embodiment, the interval 32b, which is situated between an outer perimeter of each of the active regions 5 sectioned by the trenches 4 in the pixel portion and an outer perimeter of the hole 33 formed in said each of the active regions 5, is smaller than the interval 32a in the peripheral circuit portion.

The intervals 32a have a common size in the respective active regions 5 in the peripheral circuit portion, and the intervals 32b also have a common size in the respective active regions 5 in the pixel portions. Further, the interval 32a and the interval 32b satisfy the above-described magnitude relation (intervals 32a>intervals 32b), and sizes of the same are set in accordance with the CMP speed.

More preferably, the interval 32a and the interval 32b may be set such that an area of remaining regions per unit area of the whole active regions 5 included in a part of the pixel portion where the STI step height is to be corrected, the remaining regions being obtained by subtracting the hole regions 33 formed in the whole active regions 5 from the whole active regions 5, is equal to an area of remaining regions per unit area of the whole active regions 5 included in the peripheral portion, the remaining regions being obtained by subtracting the hole regions 33 formed in the whole active regions 5 from the whole active regions 5. Alternatively, the interval 32a and the interval 32b may be set such that a result (A1/S1) of a division of the area (A1) of remaining regions by an area (S1) of the whole active regions 5 in a part of the pixel portion where the STI step height is to be corrected, the remaining region being obtained by subtracting the hole regions 33 formed in the whole active regions 5 from the whole active regions 5, is equal to a result (A2/S2) of division of the area of the remaining regions by an area (S2) of the whole active regions 5 in the peripheral circuit portions, the remaining regions being obtained by subtracting the hole regions 33 formed in the whole active regions 5 from the whole active regions 5.

Figure 2:
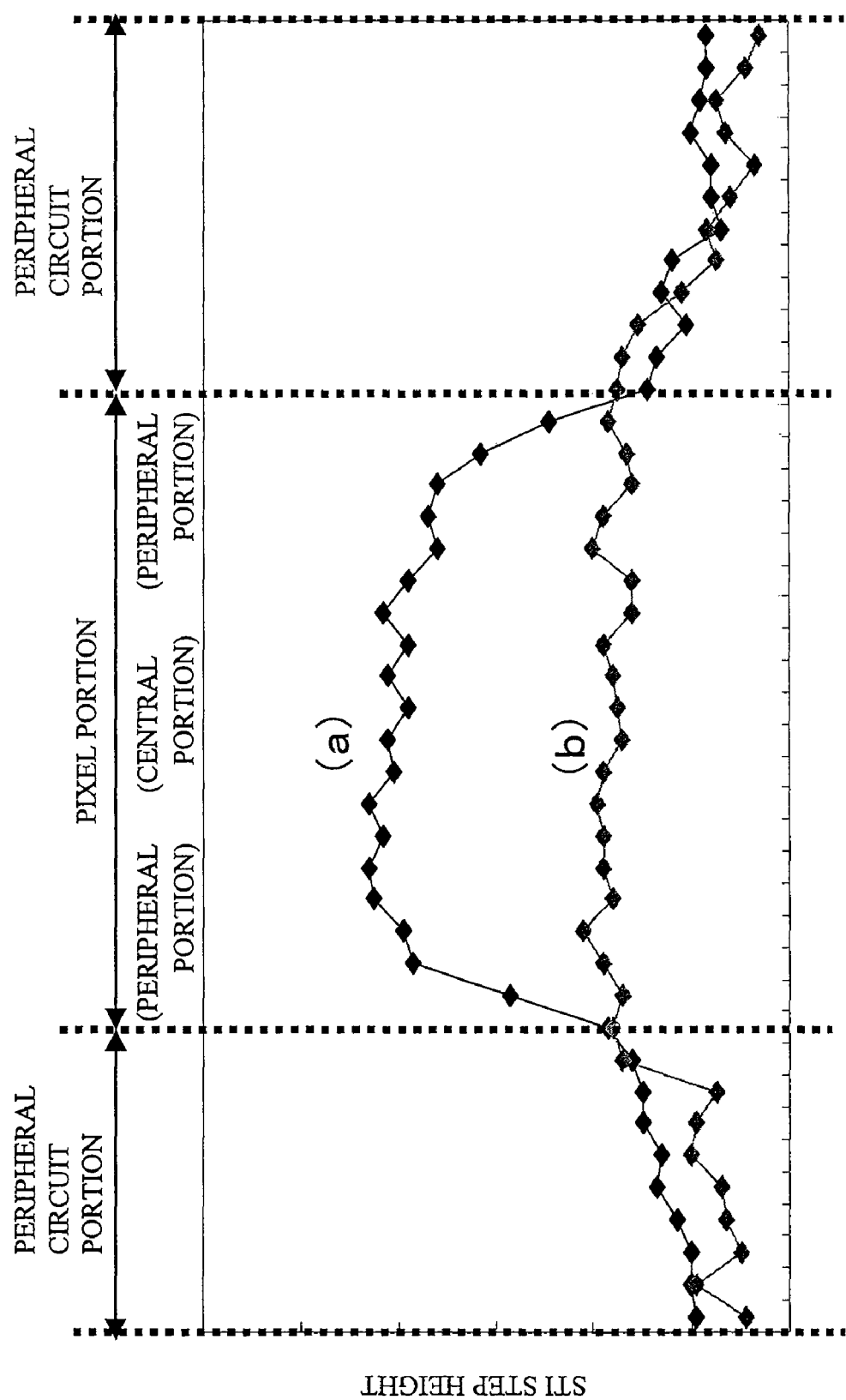
FIG. 2 is a graph showing a result of a case where the method of production of the semiconductor device according to the present invention is applied to forming an STI structure in the MOS type solid-state imaging device.

FIG. 2 is a graph showing a result of a case where the method of production of the semiconductor device according to the present embodiment is applied to forming the STI structure in the MOS type solid-state imaging device. In FIG. 2, the horizontal axis indicates a position on a chip of the MOS type solid-state imaging device, and the vertical axis indicates the STI step height. A graph (a) shows a result based on the conventional method of production in which the interval 32b has the same size as the interval 32a, whereas a graph (b) shows a result based on the method of production according to the present embodiment in which the interval 32b is smaller than the interval 32a.

The graph (a) indicates that the difference in the STI step height between in the peripheral circuit portion and in the pixel portion is several 10 nm, whereas the graph (b) indicates that the difference in the STI step height between in the peripheral circuit portion and in the pixel portion is several nm. As a result, with the method of production of the semiconductor device according to the present embodiment, the interval 32b is set smaller than the interval 32a, whereby the difference in the STI step height between in the peripheral circuit portion and in the pixel portion is reduced to approximately one tenth as compared with the conventional method. That is, with the method of production of the semiconductor device according to the present embodiment, it is possible to prevent the STI step height in the pixel portion from becoming high.

Further, in the graph (a), a bias in the STI step height between at the central portion and at the peripheral portion in the pixel portion is greater than that in the graph (b). That is, in the graph (a), a difference between the STI step height at the central portion of the pixel portion and the STI step height at the peripheral portion in the pixel portion is greater than that in the graph (b). As a result, with the method of production of the semiconductor device according to the present embodiment, the interval 32b is set smaller than the interval 32a, whereby it is possible to sufficiently suppress the bias in the STI step height in the pixel portion.

As above described, in the present embodiment, the interval 32b in the pixel portion is set smaller than the interval 32a in the peripheral circuit portion. Accordingly, volumes of the silicon dioxide film and the silicon nitride film, which are polished by using the CMP method, can be equalized in the pixel portion and the peripheral circuit portion. Therefore, it is possible to set the speed of polishing based on the CMP method to be equalized in the pixel portion and in the peripheral circuit portion. As a result, it is possible to sufficiently prevent the STI step height in the pixel portion from becoming high. Further, it is possible to sufficiently suppress the bias in the STI step height in the pixel portion.

The above description is exemplified by the case where the holes 33 are formed in both the pixel portion and the peripheral circuit portion, however, is not limited thereto. In accordance with a ratio of a total area of the active regions 5 in the pixel portion to a total area of the active regions 5 in the peripheral circuit portion, the holes 33 may be formed only in the pixel portion as shown in FIGS. 8 and 9. In this case, it is also possible to sufficiently prevent the STI structure in the pixel portion from becoming high, and to sufficiently suppress the bias in the STI step height.

Figure 3:
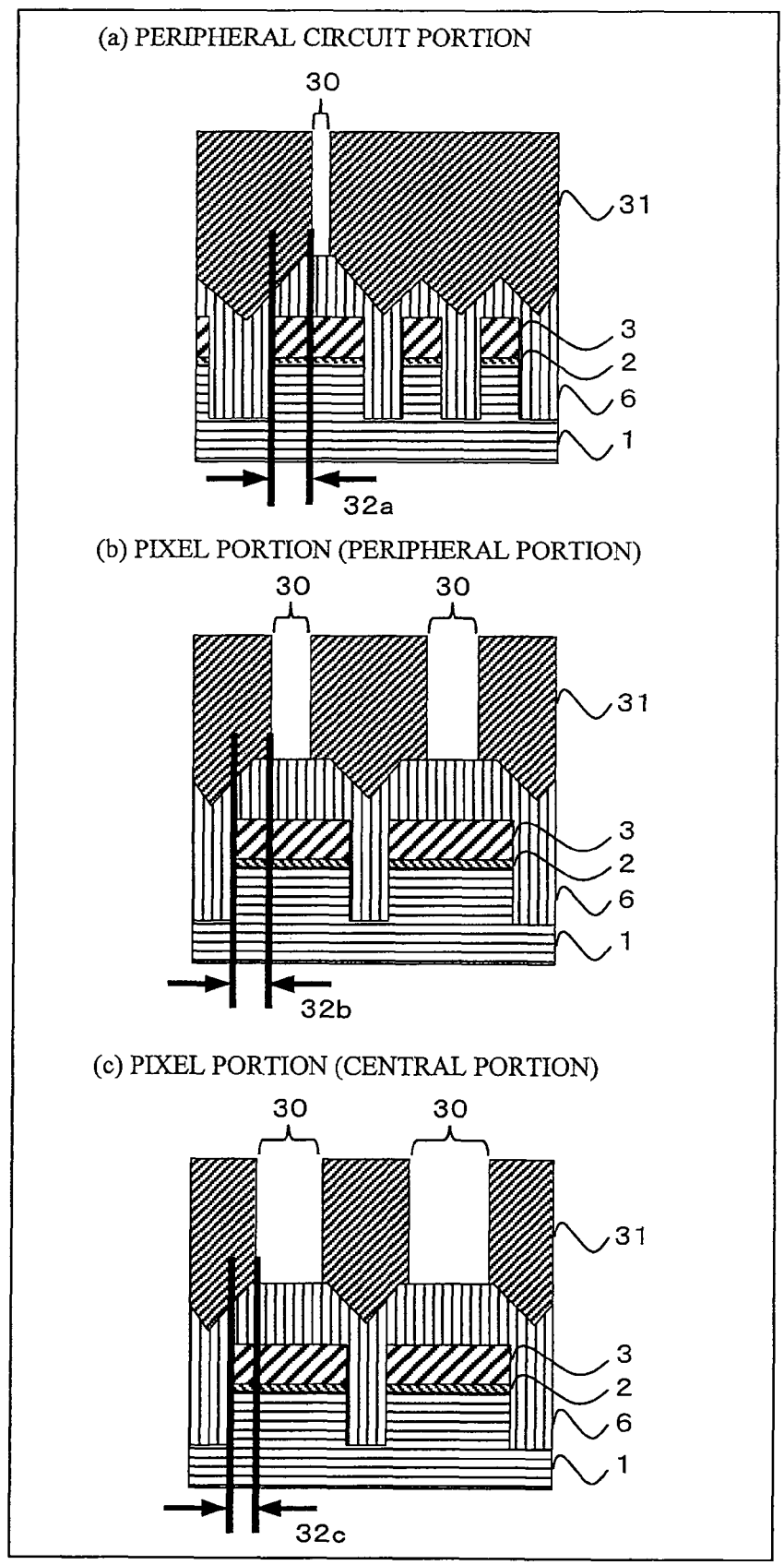
FIG. 3 is a diagram showing a cross-sectional view of the semiconductor device in the case where an interval in a central portion of a pixel portion is different from that in a peripheral portion of the same.

Further, FIG. 1 exemplifies a case where the intervals 32b in the active regions 5 in the pixel portions have a common size (that is the intervals 32b have common size regardless of the central portion and the peripheral portion in the pixel portion), however, is not limited thereto. As shown in FIG. 3, the interval 32*b* may be set so as to gradually become wider as it goes from the central portion to the peripheral portion in the pixel portion. FIG. 3 is a diagram showing a cross-sectional view of the semiconductor device in the case where a size of the interval varies depending on whether the interval is in the central portion or in the peripheral portion in the pixel portion. As shown in FIG. 3, the interval 32*c* situated in the central portion of the pixel portion, is smaller than the interval 32*b* situated in the peripheral portion. The magnitude relation of the interval shown in FIG. 3 satisfies interval 32*a*>interval 32*b*>interval 32*c*. Further, the interval 32*a* shown in FIG. 3 is the same in size as the interval 32*a* shown in FIG. 1, and the interval 32*b* shown in FIG. 3 may be the same in size as the interval 32*b* shown in FIG. 1. In this manner, the interval 32*b* is gradually growing wider as it goes from the central portion to the peripheral portion of the pixel portion, whereby it is possible to further suppress the bias in the STI step height in the pixel portion, and consequently a further preferable result can be obtained.

While the invention has been described in detail, the foregoing description is in all aspects illustrative and not restrictive. It is understood that numerous other modifications and variations can be devised without departing from the scope of the invention.

What is claimed is:

1. A method of production of a semiconductor device which includes a first circuit region and a second circuit region each having active regions for forming elements, and in which a total area of the active regions included in the first circuit region in proportion to a whole area of the first circuit region is greater than a total area of active regions included in the second circuit region in proportion to a whole area of the second circuit region, the method of production comprising:

forming a first insulating film on a whole of the first circuit region and a whole of the second circuit region which are situated on a semiconductor substrate, and forming a pattern having element isolation regions which are open and which section the active regions included in each of the first circuit region and second circuit region by selectively etching the first insulating film;

forming trenches at all the element isolation regions by etching the semiconductor substrate using the first insulating film having the pattern formed therein as a mask;

forming a second insulating film so as to cover the whole of the first circuit region and the whole of the second circuit region which are situated on the first insulating film having the pattern formed therein, and so as to fill inside the trenches;

forming holes in the active regions which are sectioned by the element isolation regions by selectively etching the second insulating film; and removing the second insulating film, leaving the second insulating film only inside the trenches, wherein at the time of forming the holes, an interval between an outer perimeter of each of the active regions sectioned by the element isolation regions and an outer perimeter of each of the holes formed in said each of the active regions is set such that the interval in the first circuit region is smaller than the interval in the second circuit region.

2. The method of production of the semiconductor device according to claim 1, wherein the intervals in the first circuit region and in the second circuit region are set such that, with respect to a unit area of the active regions which are sectioned by the element isolation regions, an area of remaining regions in the first circuit region is equal to that in the second circuit region, the area of the remaining regions in the first circuit region and the second circuit region being obtained by subtracting an area of the holes in the active regions from an area of the active regions.

3. The method of production of the semiconductor device according to claim 1, wherein the intervals in the first circuit region and in the second circuit region are set such that a result of division of a total area of the remaining regions by the total area of the active regions which are sectioned by the element isolation regions in the first circuit region, the total area of the remaining regions being obtained by subtracting a total area of the holes in the active regions from the total area of the active regions in the first circuit region, is equal to a result of division of the same in the second circuit region.

4. The method of production of the semiconductor device according to claim 1, wherein the semiconductor device is a solid-state imaging device,
the first circuit region is a pixel portion having arranged thereon a plurality of pixels each having a photodiode which is formed in each of the active regions and which performs photoelectric conversion on an incident light, and
the second circuit region is a peripheral circuit portion which has a plurality of transistors formed in the active regions.

5. The method of production of the semiconductor device according to claim 4, wherein the intervals in the pixel portion are set with respect to each of the active regions, which are sectioned by the element isolation regions, such that the intervals become larger going from a central portion to a peripheral portion of the pixel portion.

6. The method of production of the semiconductor device according to claim 1, further comprising:

forming a conductive film on the semiconductor substrate after the second insulating film is left inside the trenches only; and
forming electrodes or wirings which extend over the second insulating film left inside the trenches only by selectively etching the conductive film.

7. A method of production of a solid-state imaging device which includes a pixel portion having arranged thereon a plurality of pixels respectively having photodiodes which are formed in active regions and which perform photoelectric conversion on an incident light, and also includes a peripheral circuit portion which has a plurality of transistors formed in the active regions, the method of production comprising:

forming a first insulating film on a whole of the pixel portion and on a whole of the peripheral portion both of which are situated on a semiconductor substrate, and forming, by selectively etching the first insulating film, a pattern having element isolation regions which are open and which section the active regions included in each of the pixel portion and the peripheral portion;

forming trenches at the element isolation regions by selectively etching the semiconductor substrate using the first insulating film which has the pattern formed therein as a mask;

forming a second insulating film so as to cover the whole of the pixel portion and the whole of the peripheral portion which are situated on the first insulating film which has the pattern formed therein, and so as to fill inside the trenches;

forming, by selectively etching the second insulating film, holes in the active regions which are sectioned by the element isolation regions; and removing the second insulating film, leaving the second insulating film only inside the trenches, wherein at the time of forming the holes, the holes are formed only in the pixel portion.

8. The method of production of the semiconductor device according to claim 1, wherein the removal of the second insulating film, leaving the second insulating film only inside the trenches, is performed by polishing the second insulating film.

9. The method of production of the solid-state imaging device according to claim 7, wherein the removal of the second insulating film, leaving the second insulating film only inside the trenches, is performed by polishing the second insulating film.

* * * * *